US010686371B1

(12) United States Patent
Lee et al.

(10) Patent No.: US 10,686,371 B1
(45) Date of Patent: Jun. 16, 2020

(54) PROTECTION OF CHARGE PUMP CIRCUITS FROM HIGH INPUT VOLTAGES

(71) Applicant: Dialog Semiconductor (UK) Limited, London (GB)

(72) Inventors: Jong Lee, Pleasanton, CA (US); Sabin Eftimie, San Jose, CA (US)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/237,168

(22) Filed: Dec. 31, 2018

(51) Int. Cl.

| | |
|---|---|
| ***H02M 3/07*** | (2006.01) |
| ***G05F 1/575*** | (2006.01) |
| ***H02M 1/32*** | (2007.01) |
| ***H03K 5/24*** | (2006.01) |
| *G01R 19/165* | (2006.01) |

(52) U.S. Cl.
CPC .............. *H02M 3/07* (2013.01); *G05F 1/575* (2013.01); *H02M 1/32* (2013.01); *H03K 5/24* (2013.01); *G01R 19/16528* (2013.01)

(58) Field of Classification Search
CPC .......... H02M 3/07; H02M 3/073; H02M 7/10; H02M 2003/077; H02M 2003/076
USPC .................................................. 327/535–541
See application file for complete search history.

(56) References Cited

U.S. PATENT DOCUMENTS 5,180,964 A 1/1993 Ewing
6,300,820 B1 * 10/2001 Fotouhi .................. H02M 3/07 327/536
RE37,609 E 3/2002 Bittner
6,452,816 B2 9/2002 Kuranuki et al.
6,545,882 B2 4/2003 Yang
6,885,176 B2 4/2005 Librizzi
7,098,641 B2 8/2006 King
7,368,897 B2 5/2008 Qahouq et al.
7,403,400 B2 7/2008 Stanley
(Continued)

FOREIGN PATENT DOCUMENTS

CN 106130344 11/2016
DE 2 323 482 11/1974

OTHER PUBLICATIONS

PCT International Search Report and Written Opinion, PCT Application No. PCT/US2009/064618, dated Jan. 13, 2010, 10 pages.
PCT International Search Report and Written Opinion, PCT Application No. PCT/US2010/023219, dated Apr. 12, 2010, 7 pages.
(Continued)

*Primary Examiner* — Nguyen Tran
(74) *Attorney, Agent, or Firm* — Saile Ackerman LLC; Stephen B. Ackerman

(57) ABSTRACT

A power converter and method using a flying capacitor, a first transistor, a second transistor, a third transistor, a fourth transistor, and a driver circuit are presented. The first transistor is coupled between an input terminal and a first terminal of the flying capacitor. The second transistor is coupled between the first terminal of the flying capacitor and an output terminal. The third transistor is coupled between the output terminal and a second terminal of the flying capacitor. The fourth transistor is coupled between the second terminal of the flying capacitor and a reference potential. The driver circuit is coupled between a high side power rail and a low side power rail. There is a regulation circuit to regulate a high side voltage of the high side power rail such that the regulated high side voltage is independent of an input voltage at the input terminal.

21 Claims, 11 Drawing Sheets

(56) References Cited

U.S. PATENT DOCUMENTS

| | | | | |
|---|---|---|---|---|
| 7,804,282 | B2 | 9/2010 | Bertele | |
| 8,018,212 | B1 | 9/2011 | Petricek | |
| 8,018,743 | B2 | 9/2011 | Wang et al. | |
| 8,049,481 | B2 | 11/2011 | Li et al. | |
| 9,929,653 | B1 | 3/2018 | Mercer et al. | |
| 9,997,946 | B2 | 6/2018 | Kogler et al. | |
| 10,152,937 | B2 * | 12/2018 | Abe | G09G 3/3648 |
| 2006/0273772 | A1 | 12/2006 | Groom | |
| 2011/0267018 | A1 | 11/2011 | Tao | |
| 2015/0002116 | A1 | 1/2015 | Bernon-Enjalbert et al. | |
| 2016/0043712 | A1 * | 2/2016 | Okuda | G06K 7/10237 327/382 |
| 2016/0105110 | A1 | 4/2016 | Houston et al. | |
| 2016/0294277 | A1 | 10/2016 | Romeo | |
| 2018/0287489 | A1 | 10/2018 | Ozanoglu et al. | |

OTHER PUBLICATIONS

"Buck-Boost Converter Controlled by Hysteretic PWM Method with Input Voltage Feedforward," by Tomonori Watanabe et al., 2011 IEEE 33rd International Telecommunications Energy Conference (INTELEC), Oct. 9-13, 2011, 6 pages.

German Office Action, File No. 10 2017 212 349.4, Applicant: Dialog Semiconductor (UK) Limited, dated Mar. 13, 2018, 9 pages and English language translation, 7 pages.

Co-pending U.S. Appl. No. 16/050,746, filed Jul. 31, 2018, "Multilevel Power Converter with Light Load Flying Capacitor Voltage Regulation", by Aravind Mangudi et al., 35 pages.

"The forgotten converter," by Greg Lubarsky, Texas Instruments, Jul. 8, 2015, 10 pages, www.ti.com/lit/wp/slpy005/slpy005.pdf.

DA9318 High-Efficiency, 10 A, High-Voltage Direct Charger, 4 pages, Copyright Dialog Semiconductor 2017, www.dialog-semiconductor.com.

* cited by examiner

PROTECTION OF CHARGE PUMP CIRCUITS FROM HIGH INPUT VOLTAGES

TECHNICAL FIELD

The present document relates to charge pump circuits. In particular, the present document relates to charge pump circuits capable of regulating internal driver supply voltages for protecting the circuit components of a charge pump in case of overvoltages or overcurrents.

BACKGROUND

In a DC (direct current)/DC power converter, such as e.g. a charge pump circuit, an input voltage may be transformed into a specified output voltage with the help of a plurality of switching elements and at least one capacitor for temporarily storing an electrical charge. At the same time, the input voltage is typically used to control circuitry for controlling the switching behavior of the plurality of switching elements. Said control circuitry may e.g. include driver circuits for driving the gate voltages of said transistors. In case of an overvoltage or overcurrent at the input of the charge pump, both the driver circuits as well as the transistors themselves may be damaged if the driver circuits or the transistors are not designed to withstand high input voltages or currents. As a remedy, one may use driver circuits and transistors which are robust against high input voltages and currents. However, this may result e.g. in a decreased power conversion efficiency or in an increased total area required for implementing the charge pump compared to scenarios where e.g. low voltage components are used.

Several techniques of protecting a charge pump from an overcurrent and/or overvoltage at its input have been presented in the literature. For example, methods of linear voltage regulation have been suggested at the input of a charge pump. By adding a linear regulator (such as e.g. a low-dropout LDO regulator) at the input of a charge pump, the input voltage is dropped (or regulated) before a charge pump divides the dropped voltage to one half for output. However, a power device for the linear regulation must be added in series on the current path of a charge pump. And that additional power device may take significant die area and burn extra power even in the case that the charge pump is switching for voltage division without using the protection/regulation function implemented by the additional linear regulator.

SUMMARY

The present document addresses the above mentioned technical problems. In particular, the present document addresses the technical problem of providing an improved overvoltage/overcurrent protection technique for protecting the internal components of a charge pump such as e.g. transistors and the driving circuits for driving said transistors.

According to an aspect, a power converter comprises a flying capacitor, a first transistor, a second transistor, a third transistor, a fourth transistor, and a driver circuit for driving one of the four transistors. The first transistor is coupled between an input terminal of the power converter and a first terminal of the flying capacitor. The second transistor is coupled between the first terminal of the flying capacitor and an output terminal of the power converter. The third transistor is coupled between the output terminal of the power converter and a second terminal of the flying capacitor. The fourth transistor is coupled between the second terminal of the flying capacitor and a reference potential. The driver circuit is coupled between a high side power rail and a low side power rail. The power converter further comprises a regulation circuit configured to regulate a high side voltage of the high side power rail such that the regulated high side voltage is independent of an input voltage at the input terminal of the power converter Due to the arrangement of transistors relative to the capacitive element, the described power converter may also be denoted as a charge pump. The four transistors may be of the same type or may be of different types. Each transistor may be implemented with any suitable power device, such as, for example, an n-channel or p-channel metal-oxide-semiconductor field effect transistor MOSFET, an insulated-gate bipolar transistor IGBT, a MOS-gated thyristor, or other suitable power device. Each transistor has a gate to which a respective driving voltage or control signal may be applied to control the current flowing through said transistor. The driver circuit may be configured to generate a driving voltage for driving the gate of one of the four transistors. The driver circuit may e.g. comprise an inverter circuit.

Throughout this document, the term "reference potential" is meant in its broadest possible sense. In particular, the reference potential is not limited to ground i.e. a reference potential with a direct physical connection to earth. Rather, the term "reference potential" may refer to any reference point to which and from which electrical currents may flow or from which voltages may be measured.

For example, the regulation circuit may be configured to regulate the high side voltage of the high side power rail such that the regulated high side voltage is independent of an output voltage at the output terminal of the power converter. Alternatively, the regulation circuit may be configured to regulate the high side voltage of the high side power rail such that the regulated high side voltage is independent of both the input voltage at the input terminal and the output voltage at the output terminal. As a result, the regulation circuit may be configured to protect said driver circuit and the connected transistor from an overvoltage and/or and overcurrent at the input terminal and/or the output terminal. In other words, the claimed regulation circuit may be configured to counteract a sudden increase of the high side voltage caused e.g. by an overvoltage at the input terminal by reducing said high side voltage towards a pre-determined voltage level.

In particular, the regulation circuit may be configured to regulate the high side voltage of the high side power rail such that a voltage difference between the high side voltage of the high side power rail and a low side voltage of the low side power rail does not exceed a pre-determined value. For instance, the low side power rail may be connected to the reference potential and the regulation circuit may be configured to regulate the high side voltage of the high side power rail towards a reference voltage which may be higher or lower than the input voltage at the input terminal. At this, said reference voltage may be determined by a sum of a target output voltage at the output terminal plus a positive offset voltage. Put in a different way, the high side power rail may represent a static power rail which may be regulated towards a constant voltage which is independent of both the input voltage and the output voltage of the power converter. As an advantage, the power converter can be made with low voltage devices with smaller die size and higher power conversion efficiency.

For instance, the driver circuit may be configured to drive the second transistor, the regulation circuit may comprise a comparator configured to generate an error signal by comparing the high side voltage with the reference voltage, and the regulation circuit may comprise a modulation device configured to modulate a current between the input terminal of the power converter and the high side power rail based on said error signal. For example, the modulation device may be a further transistor configured control said current via it drain-source-channel based on said error signal. The low side power rail may be coupled to the reference potential. A decoupling capacitor may be coupled between the high side power rail and the low side power rail. For instance, the decoupling capacitor may be a small, internal decoupling capacitor The power converter may further comprise a bootstrap capacitor and another driver circuit configured to drive the first transistor. The another driver circuit may be coupled between a flying high side power rail and another low side power rail. The bootstrap capacitor may be coupled between the flying high side power rail and the first terminal of the flying capacitor. The another low side power rail may be coupled to the first terminal of the flying capacitor. The regulation circuit may be configured to regulate a flying voltage of the flying high side power rail such that the flying voltage approaches a sum of a voltage at the first terminal of the flying capacitor plus a positive offset voltage. In other words, the flying voltage of the flying high side power rail is a time-varying voltage which is regulated to be always the positive offset voltage above the voltage at the first terminal of the flying capacitor. This regulation of the flying voltage may be done e.g. by temporarily connecting the flying high side power rail with the high side power rail. To be more specific, the regulation circuit may comprise a switching element configured to isolate, during a first time interval, the flying high side power rail from the high side power rail, and to connect, during a second time interval, the flying high side power rail with the high side power rail. The first time interval may have the same length as the second time interval, and the power converter may be configured to alternate between the first time interval and the second time interval and control the switching element accordingly. The flying high side power rail may be charged from the high side power rail during the second time interval. Then, during the subsequent first time interval, the voltage of the flying capacitor may is added to the flying voltage of the flying high side power rail such that the flying voltage may be larger than the input voltage during the first time interval. This increased flying voltage may be required for driving the first transistor during the first time interval.

In the first time interval, the first transistor is selected to be operated as a controllable power source i.e. to be operated as a controlled current source or as a controlled voltage source. In other words, the first transistor is operated as a variable resistive element, i.e. as a resistive element whose resistance value is continuously adaptable. As a result, the current through the first transistor may be continuously adapted or the voltage drop across the first transistor may be continuously adapted. For example, the first transistor may be a MOSFET operated in the linear region. In yet other words, the selected transistor may be controlled to limit the current through the first transistor and, thus, to limit the current which is charging the flying capacitor element during the first time interval. Since the output voltage at the output terminal of the power converter is regulated by operating the first transistor as a controllable power source, the power converter is enabled to not only divide the input voltage of into half, but to truly regulate the output voltage just as an LDO regulator.

One advantage of the described power converter is that the first transistor of the power converter may be used (a) as a controllable power source for regulation the output voltage of the power converter and (b) as a switching element when the power converter is used as a regular charge pump for dividing the input voltage into half and for doubling the output current compared to the input current. Therefore, the described implementation does not require any additional power devices and does not have additional power losses when the power converter is operated as charge pump in a pure switching mode.

The power converter may be configured to, during the first time interval, close the third transistor, and open the second transistor and the fourth transistor for generating an electrical path from the input terminal of the power converter via the first transistor and via the flying capacitor to the output terminal of the power converter. The power converter may be configured to, during the first time interval, to operate the first transistor as a controllable power source for regulating an output voltage at the output terminal of the power converter if an overvoltage is detected at the input terminal of the power converter, and to operate the first transistor as a switch which is either open or closed if no overvoltage is detected at the input terminal of the power converter.

For example, the power converter of claim may comprise a current mirror configured to control a current through the first transistor for regulating the output voltage at the output terminal of the power converter during the first time interval converter if an overvoltage is detected at the input terminal of the power converter. Said current mirror may comprise e.g. the first transistor and a complementary mirror transistor. In particular, the current mirror may be configured to copy a potentially scaled version of a reference current flowing through said complementary mirror transistor to the first transistor during said first time interval if an overvoltage is detected.

The other way round, the power converter may be configured to, during the second time interval, open the first transistor and the third transistor, and close the second transistor and the fourth transistor for generating an electrical path from the reference potential via the flying capacitor to the output terminal of the power converter.

Furthermore, the modulation device may be configured to modulate the current between the input terminal of the power converter and the high side power rail based on said error signal only during the first time interval. The comparator may be configured to generate another error signal by comparing the flying voltage at the flying high side terminal with another reference voltage during the second time interval. The regulation circuit may comprise another modulation device configured to modulate a current between the input terminal of the power converter and the flying high side power rail based on said another error signal during the second time interval.

According to another aspect, a method for operating a power converter is described. The method may comprise steps which correspond to the features of the power converter described in the present document. Specifically, the method may be tailored for a power converter comprising a flying capacitor, a first transistor, a second transistor, a third transistor, a fourth transistor, and a driver circuit for driving one of the four transistors. The method may comprise coupling the first transistor between an input terminal of the power converter and a first terminal of the flying capacitor, coupling the second transistor between the first terminal of the flying capacitor and an output terminal of the power converter, coupling the third transistor between the output terminal of the power converter and a second terminal of the flying capacitor, coupling the fourth transistor between the second terminal of the flying capacitor and a reference potential, coupling the driver circuit between a high side power rail and a low side power rail, and regulating a high side voltage of the high side power rail such that the regulated high side voltage is independent of an input voltage at the input terminal of the power converter.

The method may comprise regulating the high side voltage of the high side power rail such that a voltage difference between the high side voltage of the high side power rail and a low side voltage of the low side power rail does not exceed a pre-determined value. The method may comprise regulating the high side voltage of the high side power rail towards a reference voltage which may be lower or higher than the input voltage at the input terminal. At this, the reference voltage may be determined by a sum of a target output voltage at the output terminal plus a positive offset voltage.

The method may comprise driving, by the driver circuit, the second transistor, generating an error signal by comparing the high side voltage with a reference voltage, and modulating a current between the input terminal of the power converter and the high side power rail based on said error signal. The method may comprise providing a bootstrap capacitor and another driver circuit configured to drive the first transistor, coupling the another driver circuit between a flying high side power rail and another low side power rail, coupling the bootstrap capacitor between the flying high side power rail and the first terminal of the flying capacitor, and coupling the another low side power rail to the first terminal of the flying capacitor.

The method may comprise regulating a flying voltage at the flying high side power rail such that the flying voltage approaches a sum of a voltage at the first terminal of the flying capacitor plus a positive offset voltage. This may be achieved isolating, by a switching element, during a first time interval, the flying high side power rail from the high side power rail, and connecting, by said switching element, during a second time interval, the flying high side power rail with the high side power rail.

According to a further aspect, a software program is described. The software program may be adapted for execution on a processor and for performing the method steps outlined in the present document when carried out by the processor.

According to another aspect, a storage medium is described. The storage medium may comprise a software program adapted for execution on a processor and for performing the method steps outlined in the present document when carried out by the processor.

According to a further aspect, a computer program product is described. The computer program product may comprise instructions for performing the method steps outlined in the present document when carried out by the processor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DESCRIPTION

Figure 1:
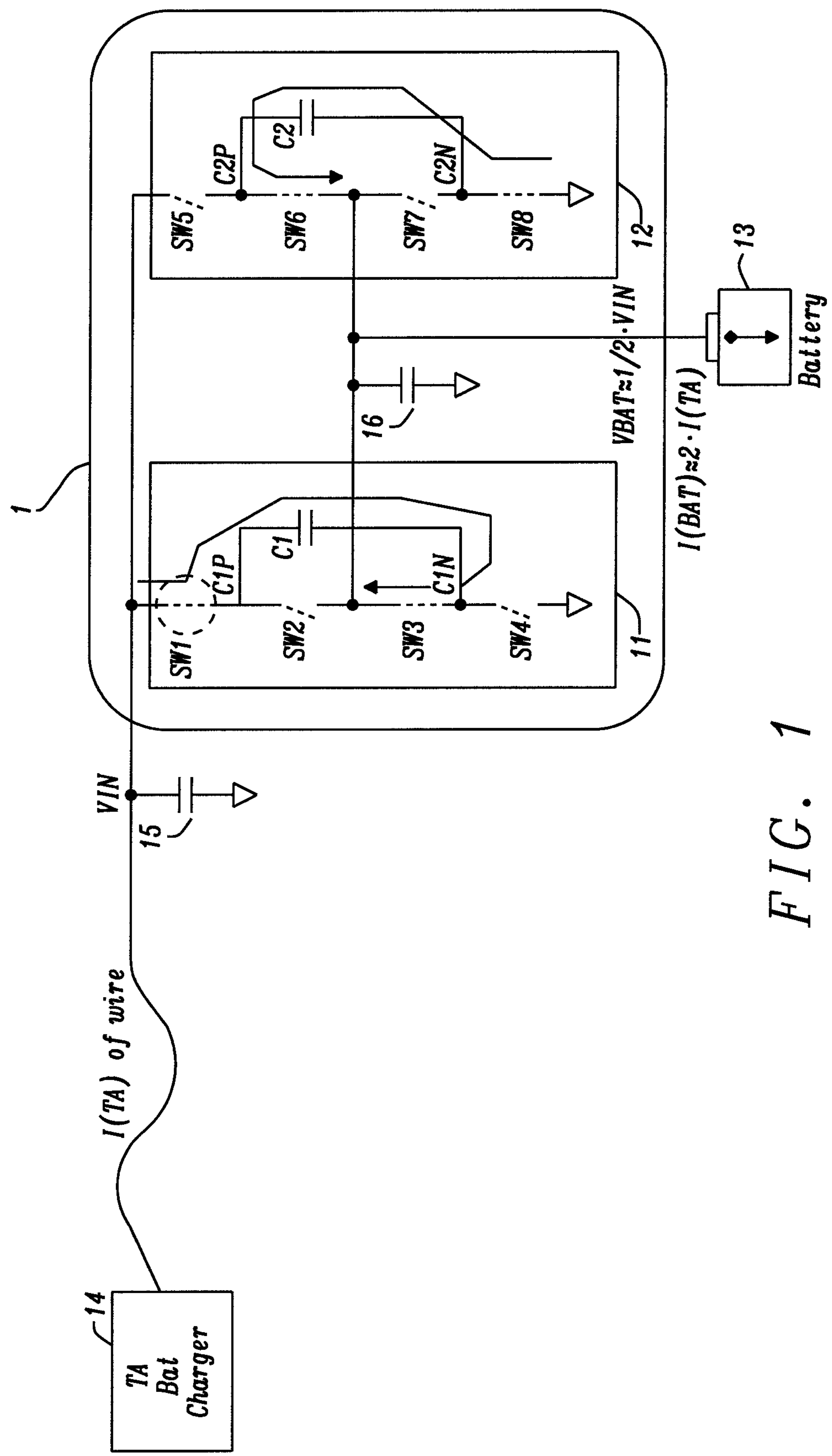
FIG. 1 shows an exemplary power converter connected between a travel adapter and a battery.

FIG. 1 illustrates an exemplary power converter 1 connected between a travel adapter 14 (also known as alternating current AC adapter, wall adapter, or domestic mains adapter) and a battery 13 for charging said battery 13. The power converter 1 comprises two identical charge pumps 11 and 12 with altogether eight power switches and two capacitors. Additionally, an input capacitor 15 is provided at the input terminal of the power converter 1 and an output capacitor 16 is provided at the output terminal of the power converter 1. The output voltage of power converter 1 is half of the input voltage of power converter 1. At the same time, the output current of power converter 1 is two times the input current of power converter 1.

Figure 2:
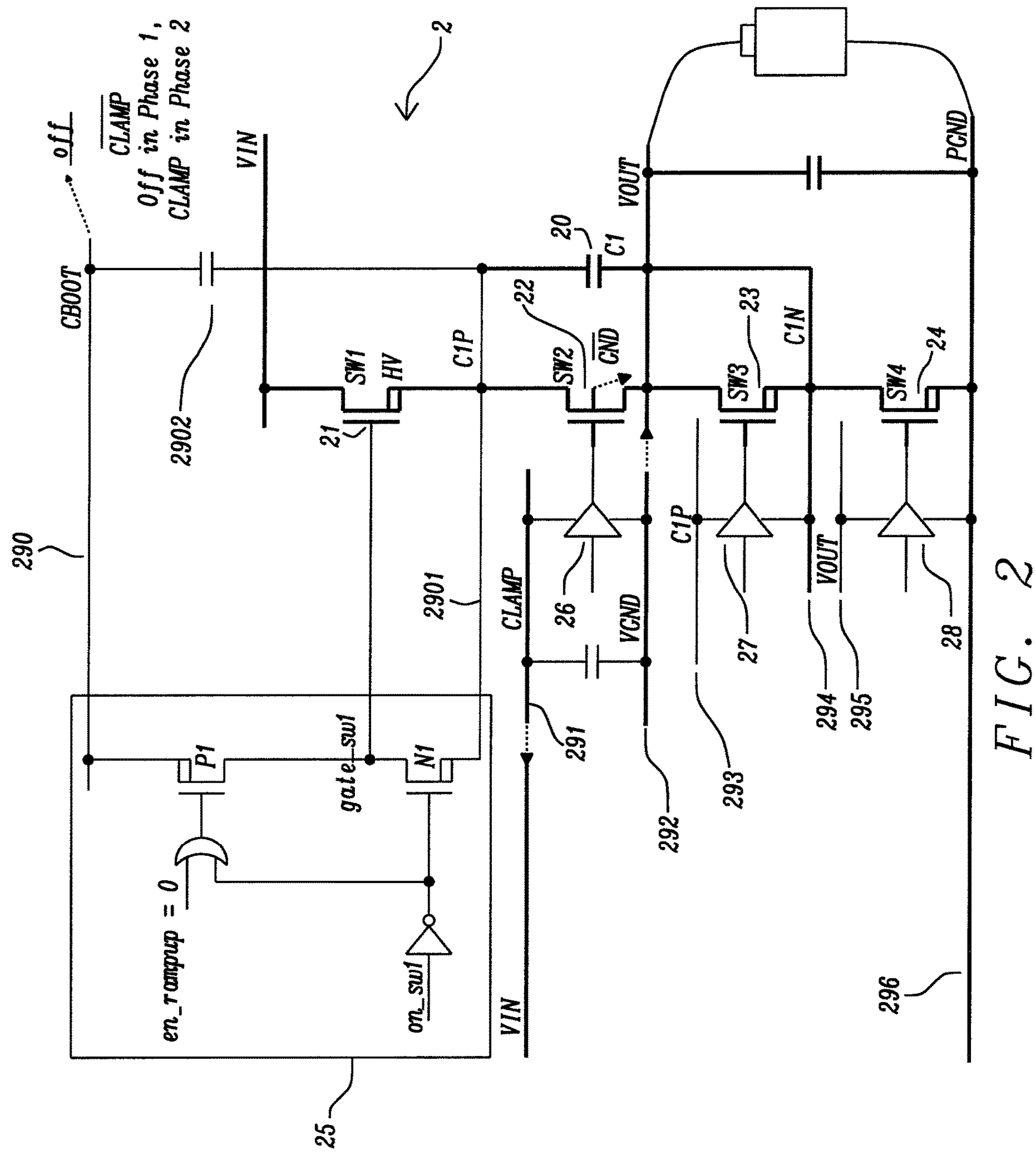
FIG. 2 shows an exemplary power converter with power rails and driver circuits.

FIG. 2 shows an exemplary power converter 2 with power rails and driver circuits. The power converter 2 comprises a flying capacitor 20, a first transistor 21, a second transistor 22, a third transistor 23, and a fourth transistor 24. The first transistor 21 is coupled between an input terminal of the power converter 2 and a first terminal of the flying capacitor. The second transistor 22 is coupled between the first terminal of the flying capacitor and an output terminal of the power converter. The third transistor 23 is coupled between the output terminal of the power converter and a second terminal of the flying capacitor. The fourth transistor 24 is coupled between the second terminal of the flying capacitor and a reference potential. A first driver circuit 25 drives the gate of the first transistor 21, wherein a high side power rail 290 (CBOOT) of the first driver circuit 25 is connected to the first terminal of the flying capacitor 20 via a bootstrap capacitor 2902. Further, a low side power rail 2901 of the first driver circuit 25 is connected directly to the first terminal C1P of the flying capacitor 20. A second driver circuit 26 drives the gate of the second transistor 22, wherein a high side power rail 291 (CLAMP) of the second driver circuit 26 is connected to the input terminal of the power converter 2 and a low side power rail 292 (VGND) of the second driver circuit 26 is connected to the output terminal of the power converter 2. A third driver circuit 27 drives the gate of the third transistor 23, wherein a high side power rail 293 of the third driver circuit 27 is connected to the first terminal C1P of the flying capacitor 20 and a low side power rail 294 of the third driver circuit 27 is connected to the second terminal C1N of the flying capacitor 20. A fourth driver circuit 28 drives the gate of the fourth transistor 24, wherein a high side power rail 295 of the fourth driver circuit 28 is connected to the output terminal (VOUT) of the power converter 2 and a low side power rail 296 of the fourth driver circuit 28 is connected to the reference potential (PGND).

Figure 3:
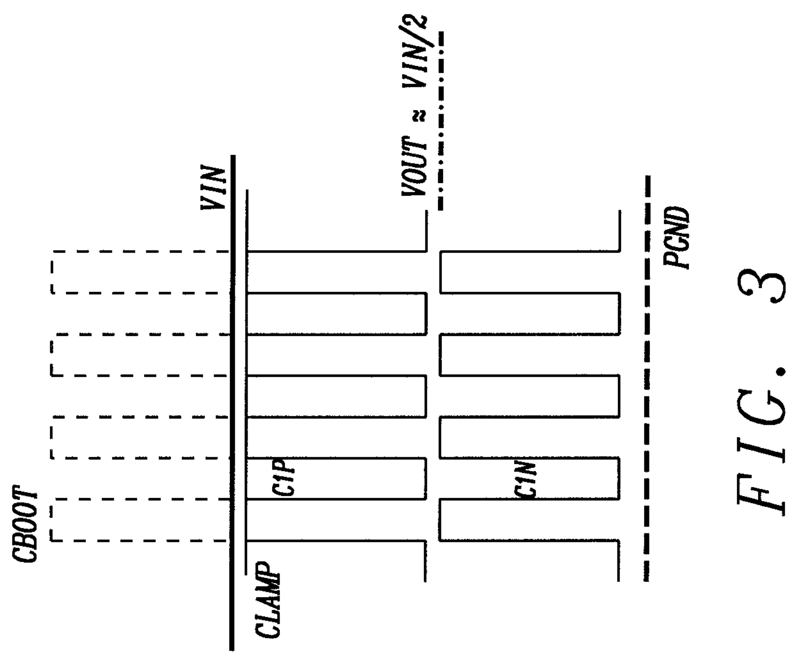
FIG. 3 shows key signals in a switching voltage-dividing charge pump.

In the example illustrated in FIG. 2, the power switch 21 is a high voltage n-channel device and it is used to protect circuits when the charge pump is turned off and powering up/down. In that time, the internal power rail of CLAMP and VGND is disconnected from VIN and VOUT, and the rail of CBOOT and C1P is also disconnected from VIN and VOUT. During operation of the charge pump, the circuit components and in particular the transistors 21, 22, 23, and 24 are fairly unprotected in case an overvoltage or overcurrent occurs at the input terminal of the power converter 2. When the charge pump is switching, maximum drain-to-source voltage of all four transistors are about one half of the input voltage and the voltage of all gate driver circuits are also determined by the output voltage of the charge pump (which is one half of its input voltage). Therefore, all the devices in the charge pump circuit are required to have maximum operating voltage rating of one half of maximum input voltage allowed. In the charge pump, if input voltage surges higher than two times of the maximum operating voltage of the devices, all the transistors and gate driver devices will be exposed high voltage stress without any protection. FIG. 3 shows key signals in the switching voltage-dividing charge pump of FIG. 2. As can be seen in FIG. 3, the voltage CBOOT at the high side power rail 290 of the first transistor 21 is boosted above the input voltage VIN whenever the first transistor 21 is closed, thereby connecting the first terminal C1P of the flying capacitor 20 to the input terminal of the power converter 2.

Figure 4:
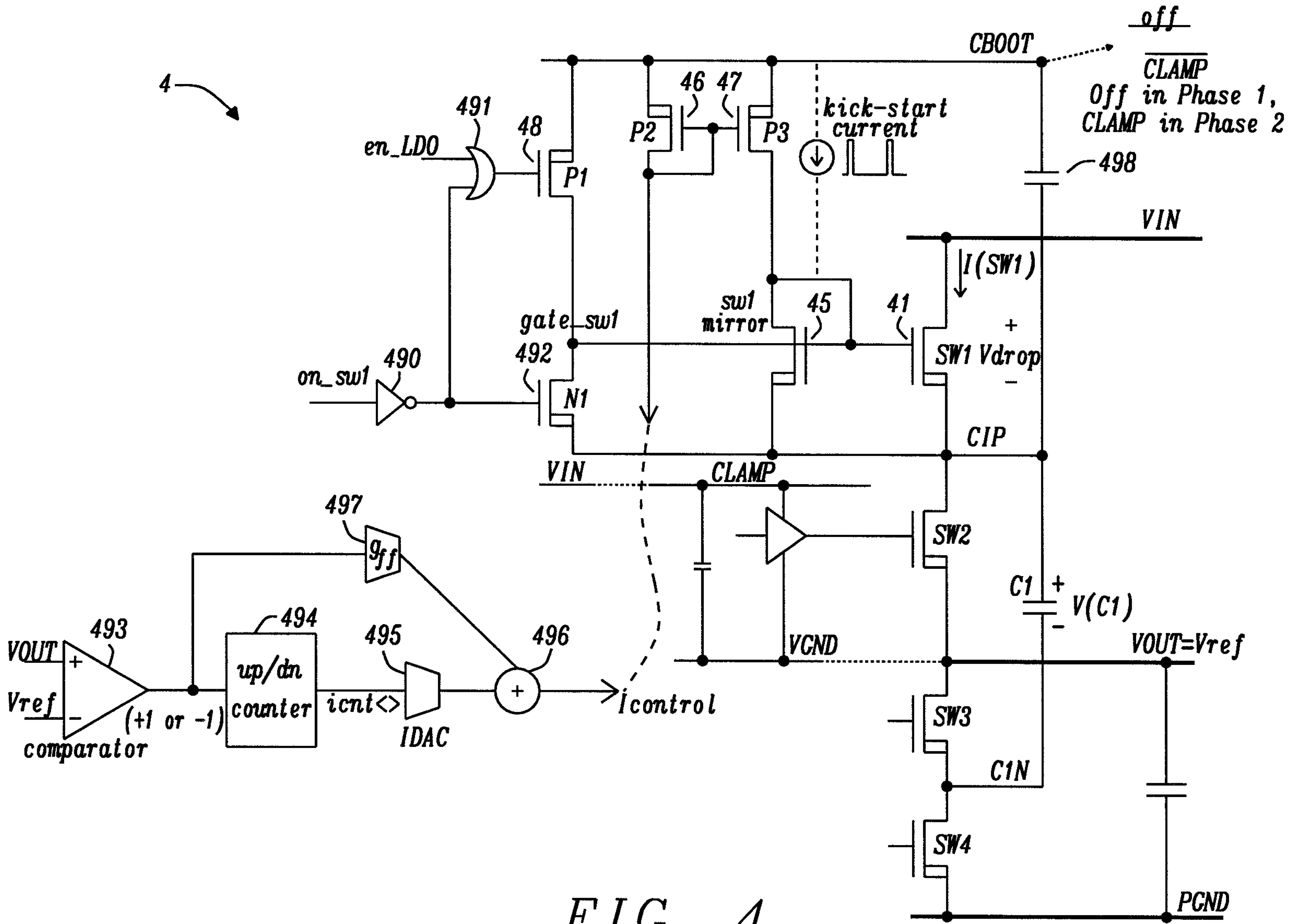
FIG. 4 shows a charge pump with a switching LDO voltage regulation loop.

As illustrated in FIG. 4, a switching LDO regulation scheme has been developed for output voltage regulation of a voltage-dividing charge pump and it is applied for protection of a battery from high input voltage of a direct-charging charge pump. In FIG. 4, an output voltage regulating loop is added in the charge pump of FIG. 2. With the switching LDO regulation circuit, the charge pump can regulate its output voltage at safe level when its input voltage is high. By regulating its output voltage, the charge pump can limit maximum drain-source voltage of SW2, SW3 and SW4 at the regulated output voltage, and it can also set voltage of gate driver supply rails of SW3 and SW4 at the output voltage. From a protection point of view, the switching LDO regulation is mainly used to limit operating voltage of charge pump circuits rather than for output voltage regulation.

In particular, FIG. 4 shows an exemplary power converter 4 with the first transistor 41 operated as a controllable power source. The exemplary power converter 4 comprises a digital feedback loop with a comparator 493, a digital counter 494, a current digital analog converter IDAC 495, a gain factor 497, and an adder 496. The comparator 493 is configured to generate an error signal by comparing a reference voltage with the output voltage of the power converter 4. The digital counter 494 is configured to generate a cumulated error signal based on the error signal, and the 4DAC 295 generates a reference current corresponding to the cumulated error signal. Gain factor 497 is then added for increasing the stability of the control loop. The current Icontrol generated at the output of adder 496 is used to control the current through the first transistor 41 via two current mirrors, wherein the first current mirror comprises transistors 46 and 47, and the second current mirror comprises transistor 45 and the first transistor 41 of the power converter 2. Additionally, logic gate 490 receives an output signal of counter 494 and a switching signal on_sw1 for switching transistor 41 in the voltage division mode (also denoted as pure switching mode). Logic gate 490 controls current flow through the first transistor 41 via driving transistor 492 when bypass transistor 48 disables the two current mirrors. Bypass transistor 48 in turn is enabled by logic gate 491, which receives enable signal en_LDO for entering the voltage regulation mode.

Figures 5A, 5B:
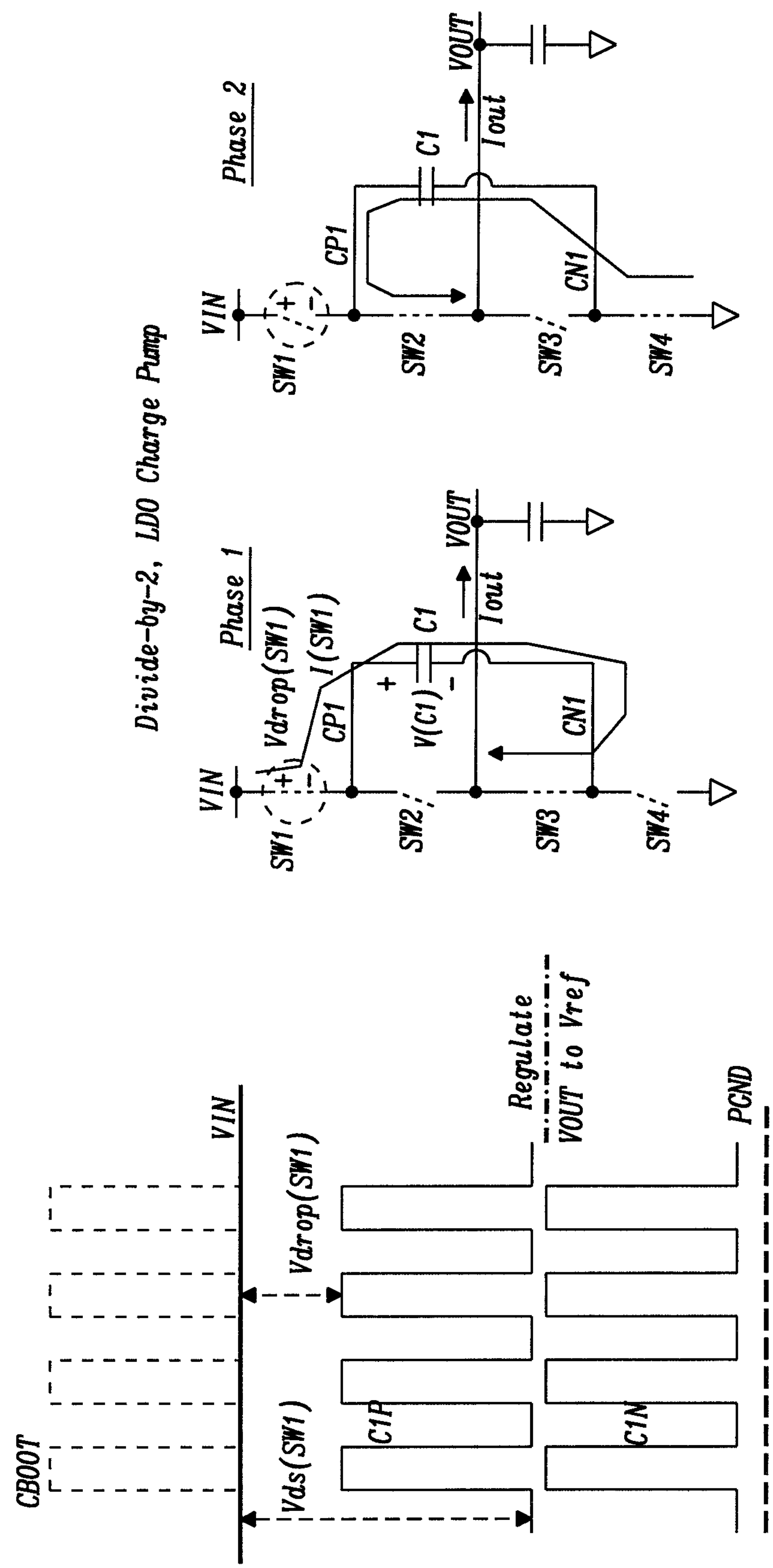
FIGS. 5A and 5B show key signals in a switching LDO voltage regulation charge pump.

FIGS. 5A and 5B show key signals in a switching LDO voltage regulation charge pump. In particular, in the LDO mode, SW1 has Vdrop (SW1) in Phase 1, which is about (VIN−2·VOUT). In Phase 2, SW1 is turned off and its drain-source voltage is about (VIN−VOUT). Because SW1 is already a high voltage device for protection of charge pump circuits while not switching, it can withstand high drain-source voltage stress in the switching LDO mode.

In FIG. 2, gate driver circuits of SW1 and SW2 are supplied by power rails (CBOOT, C1P) and (CLAMP, VGND) and voltage of those rails is determined by voltage difference of input and output, that is (VIN−VOUT). And those driver circuits are not protected from high input voltage yet. An idea is now to regulate the gate driver supply rail voltages to protect SW1 and SW2 gate driver circuits from high input voltage while the charge pump is switching.

Figure 6:
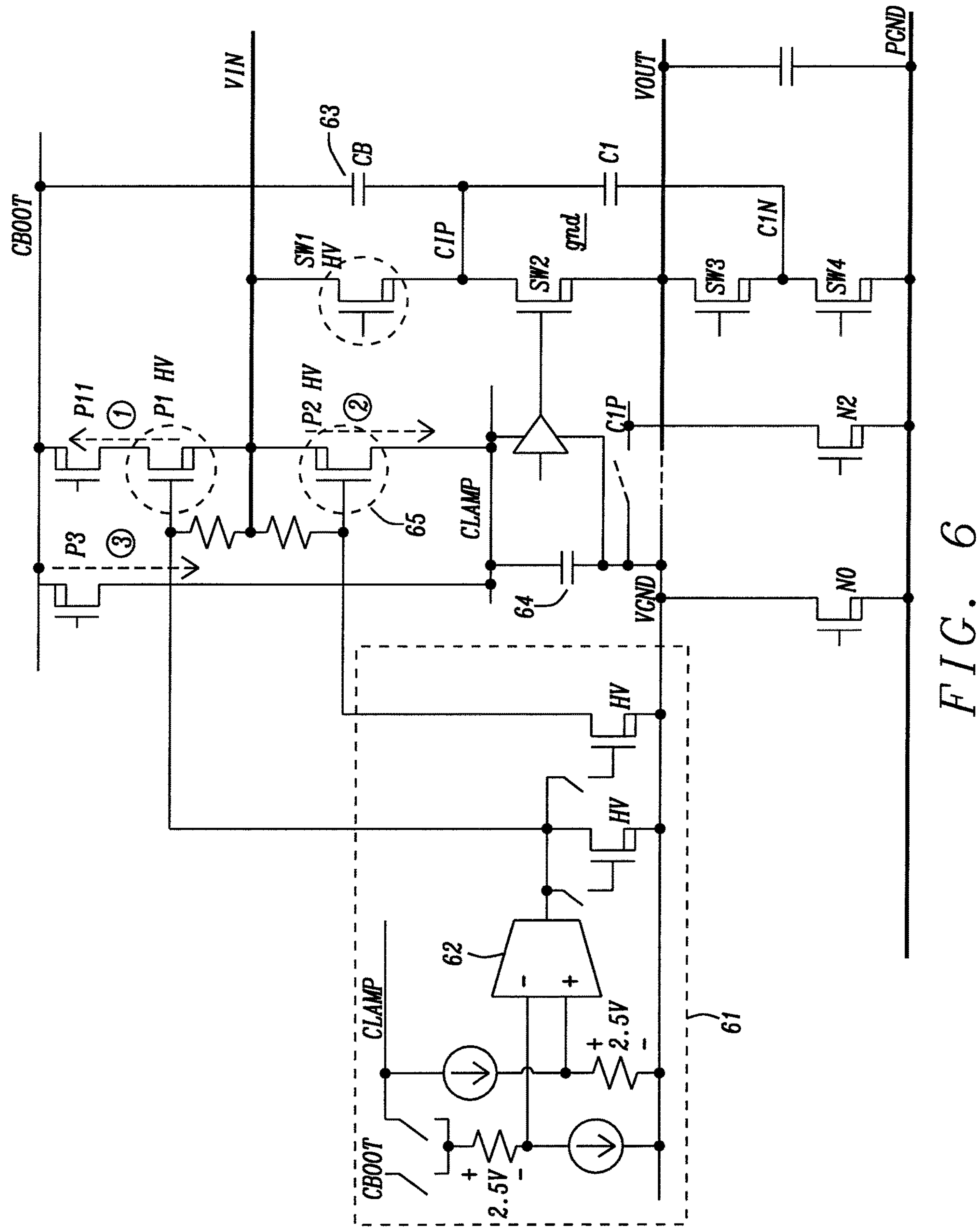
FIG. 6 shows a switching time-shared voltage regulator for CBOOT and CLAMP.

FIG. 6 is a circuit diagram of the exemplary internal regulator 61 added on an exemplary charge pump. An error amplifier (comparator) 62 is shared for regulation of both power rails. For regulation of CLAMP rail, error amplifier 62 selects CLAMP as an input and compares to 5V (internally generated), and error output current controls gate voltage of a power switch P2 (modulation device). Similarly for regulation of CBOOT rail, it selects CBOOT as an input and error current controls gate voltage of P1 (another modulation device). The external bootstrap capacitor 63 has "a couple of orders" larger capacitance value than the decoupling capacitance value of capacitor 64. Therefore, it may be easy to regulate the CBOOT voltage with the regulator circuit and maintain the bootstrap voltage without much noise while the charge pump is switching. The tiny on-chip decoupling capacitor 64 on CLAMP is fine for holding gate voltage after switching. However, it may be too small to provide current without significant voltage drop to a gate driver circuit while it is switching. In the displayed design, that issue is resolved by connecting CBOOT to CLAMP together before the SW2 gate driver is switching, to get most switching current from the large bootstrap cap.

In other words, in the power converter of FIG. 6, the regulation circuit comprises a comparator 62 configured to generate an error signal by comparing the high side voltage CLAMP with a reference voltage, and the regulation circuit comprises a modulation device 65 configured to modulate a current between the input terminal of the power converter and the high side power rail based on said error signal.

The internal regulation circuit of FIG. 6 has two major poles: one on the decoupling or bootstrap capacitor, and the other is by RC at the gate of power device. And a minor pole is at output of the error amplifier. In the loop, a compensation zero can be made at the voltage-to-current NMOS device of the error amp by adding a resistor and a capacitor in series from the NMOS gate to VGND (VOUT).

Figure 7B:
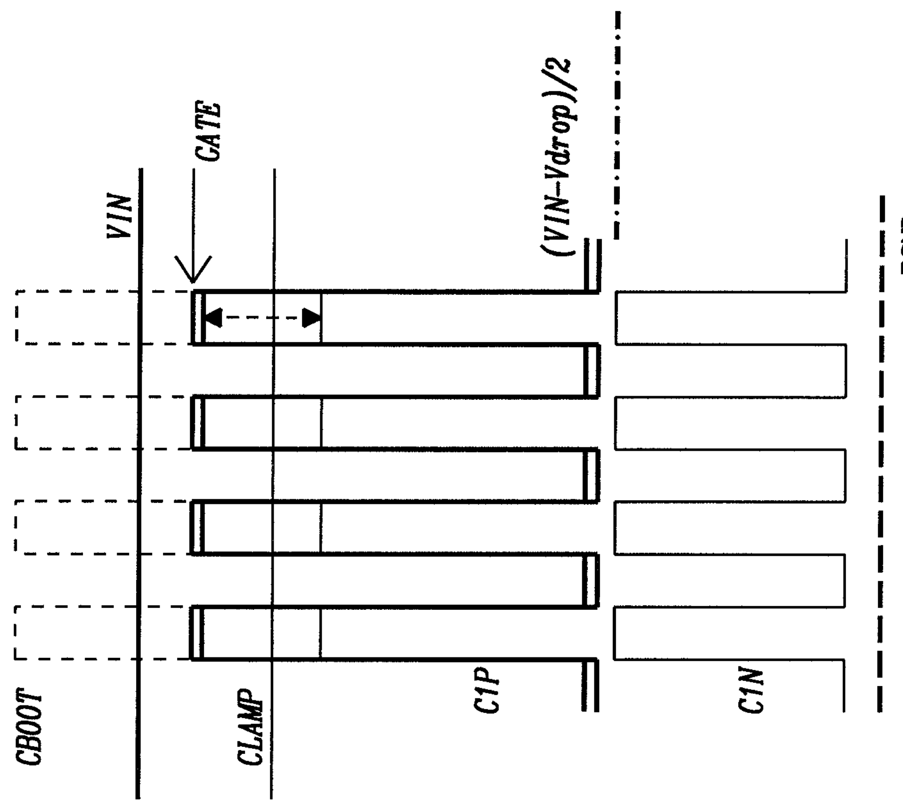
FIGS. 7A and 7B show key signals in switching LDO mode with internal CLAMP and CBOOT regulation.
Figure 7A:
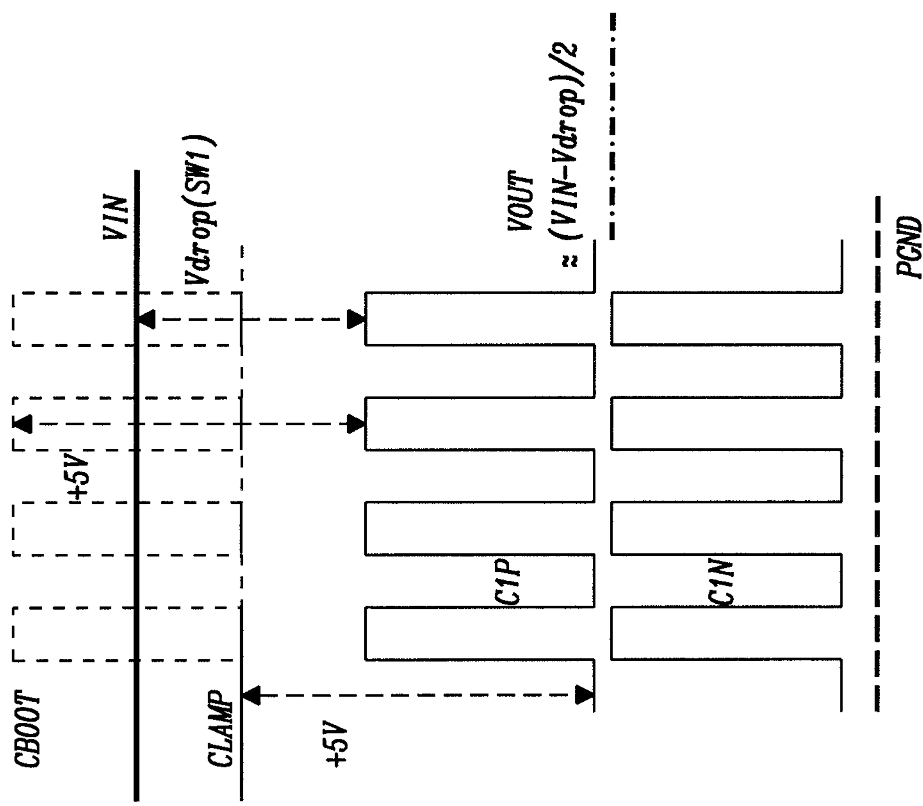

FIGS. 7A and 7B illustrate key signals in switching LDO mode with internal CLAMP and CBOOT regulation. In this example, the input voltage of the charge pump is too high for the low voltage devices of the charge pump. Therefore, the charge pump may be, for example, in the switching LDO mode regulating the output voltage at Vref. In this LDO mode, input voltage is dropped on the controlled current mirror device SW1 when the switch is turned on as a switching current mirror, and the dropped input voltage is divided to one half for regulated output voltage. Then, two internal power rails are regulated at 5V in the example. A power rail of CLAMP and VOUT is static 5V. However, in simulations, this voltage rail has significant switching ripple voltage because of small on-chip decoupling capacitance compared to the power switch gate capacitance. Then, the CBOOT rail is a flying voltage rail. It maintains 5V between CBOOT and CP and its rail voltage is pulsed by the bootstrap capacitor 36 tied to a flying switching capacitor C1.

Figure 8:
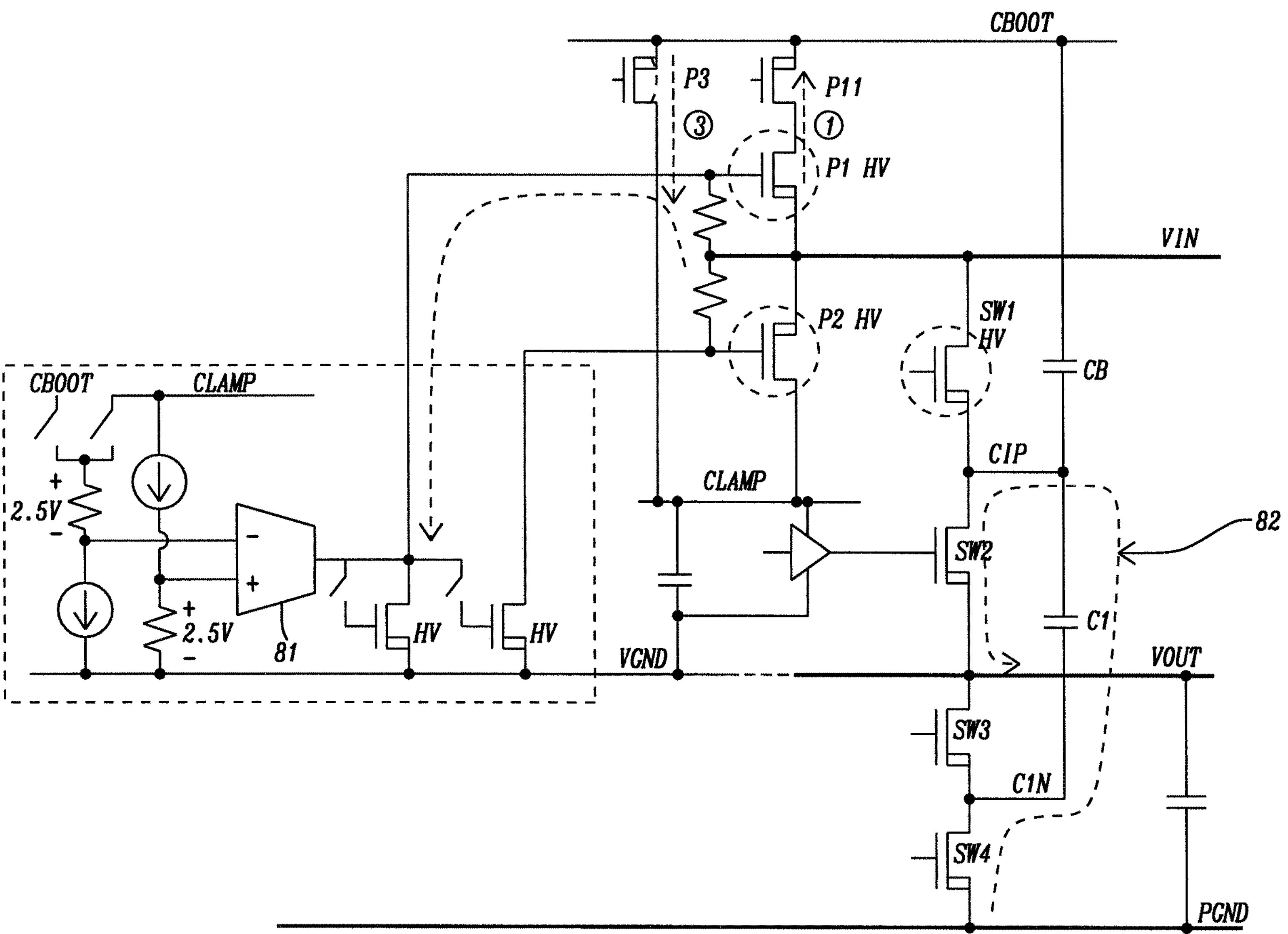
FIG. 8 shows a switching time-shared voltage regulator for CBOOT and CLAMP in phase 2.

In the switching phase 2 shown in FIG. 8, CBOOT is selected as the input of the error amplifier 81, and the error amplifier 81 controls a power device P1 gate voltage for regulation of a power rail held by the bootstrap capacitor. In this phase 2, bottom node of the bootstrap cap is tied to VOUT through SW2, and CLAMP is tied to CBOOT through power device P3 (switching element). As illustrated in FIG. 8 by the dashed arrow 82, during the phase 2, the flying capacitor C1 is discharged between a reference potential (e.g. ground) and the output terminal of the power converter.

Figure 9:
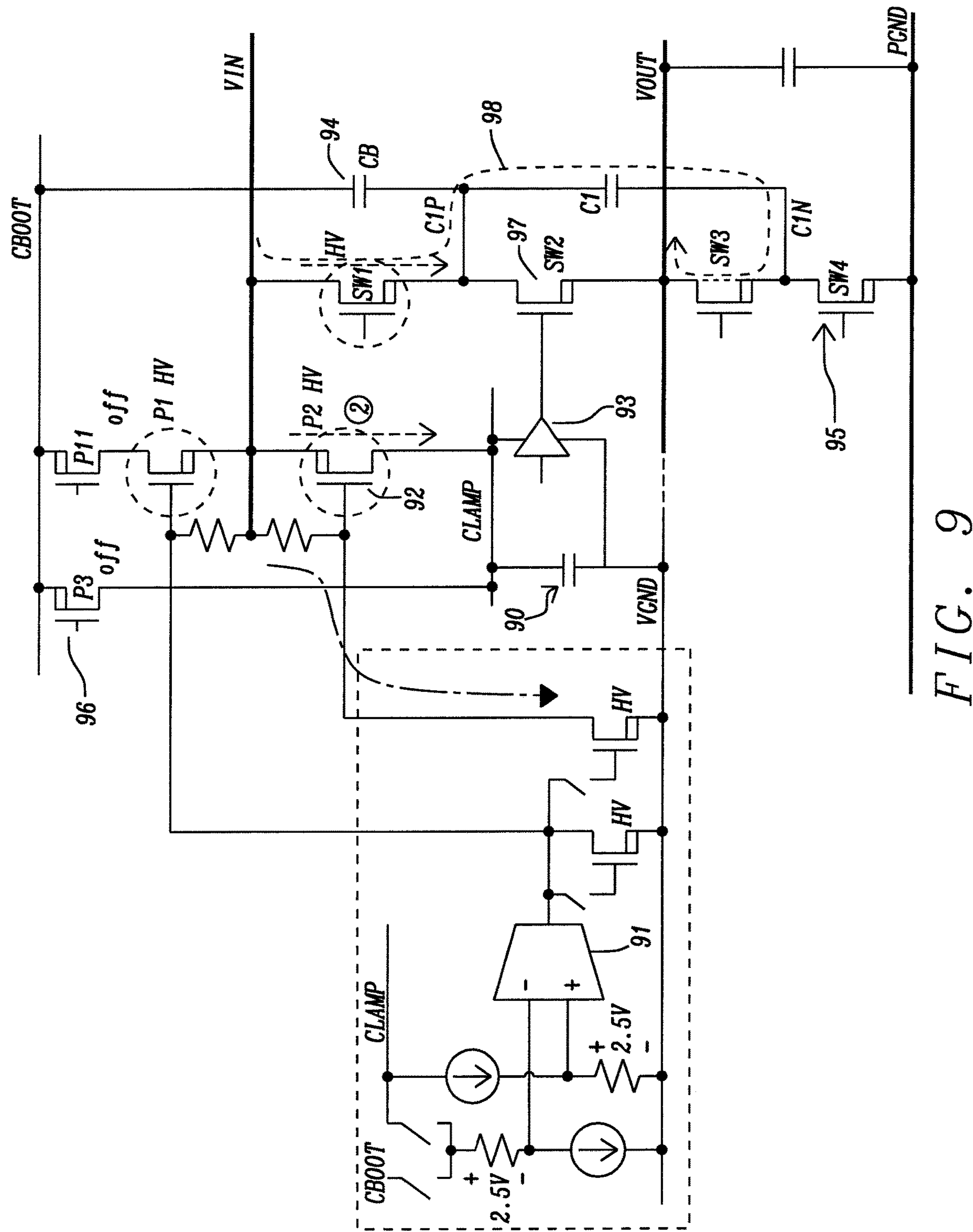
FIG. 9 shows a switching time-shared voltage regulator for CBOOT and CLAMP in phase 1.

FIG. 9 shows control circuits regulating CLAMP voltage in phase 1. As illustrated in FIG. 9 by the dashed arrow 98, during the phase 1, the flying capacitor C1 is charged through a current path between the input terminal of the power converter and the output terminal of the power converter. Moreover, since voltage of CLAMP and VGND (VOUT) rail is static, it is relatively simple to regulate CLAMP voltage on a decoupling capacitor 90 through the error amplifier 91 and power device P2 92 (modulation device). And the small decoupling capacitor 90 is fine to hold its regulated voltage for the gate driver circuit 93 when it is not switching. In this phase 1, CBOOT is flying high and its voltage is held by the bootstrap capacitor 94 only.

However, the small decoupling capacitor 90 may be too small to provide switching current and hold supply voltage without significant voltage drop, when the power switch SW2 92 is turned on before phase 2. To mitigate significant drop of the CLAMP voltage while switching, it must turn on power switch SW2 92 for example in this ordered sequence: Turn on power switch SW4 95 first and bring down CBOOT voltage, connect CLAMP to CBOOT through power device P3 96, and then turn on power switch SW2 97 with supply current from the small decoupling capacitor 90 and the large bootstrap capacitor 94.

Figure 10:
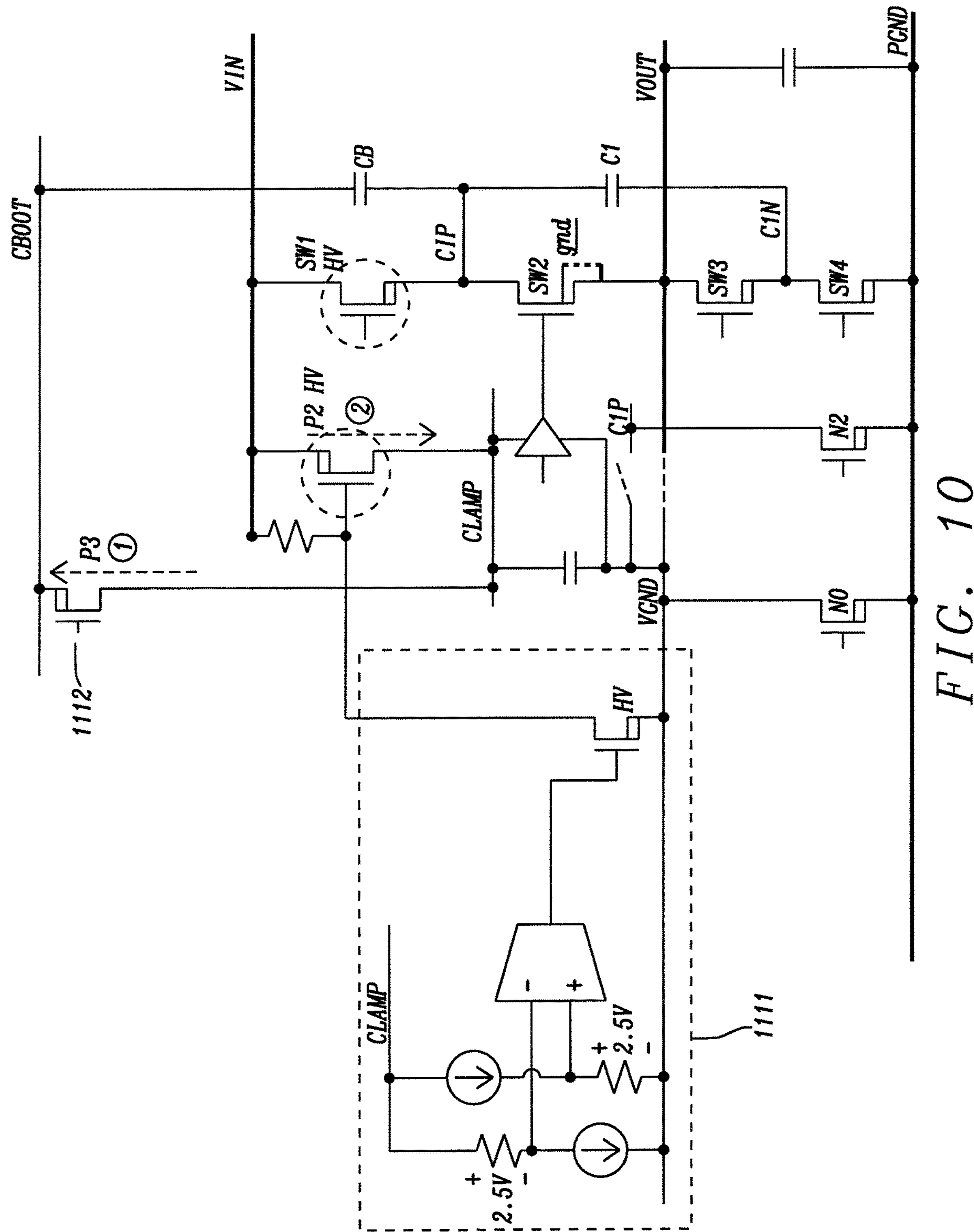
FIG. 10 shows a first variation of a charge pump with a voltage regulator.

In the possible variation illustrated in FIG. 10, the CLAMP voltage is regulated and the CBOOT voltage is charged. In FIG. 14, the internal power rail regulator 1111 regulates the CLAMP power rail voltage all the time. Then, when the CBOOT rail is in low voltage (i.e. in phase 2), CLAMP is tied to CBOOT through power device P3 1112 and CBOOT is charged from CLAMP in the switching phase (i.e. in phase 2). An advantage of this variation is on simplicity of the regulating circuit.

This invention allows to use low voltage devices for charge pump design and allows to operate charge pumps in high input voltage that would not be feasible without the novel protection. By using low voltage power switches and gate driver circuits, the area required for the overall layout is smaller and the charge pump will yield better efficiency due to low power switch resistance. When the charge pump is equipped with the switching LDO regulation and with the internal power rail regulation, the charge pump can provide a unique combination of advantages, namely output voltage regulation as well as robustness against high operating input voltage.

Figure 11:
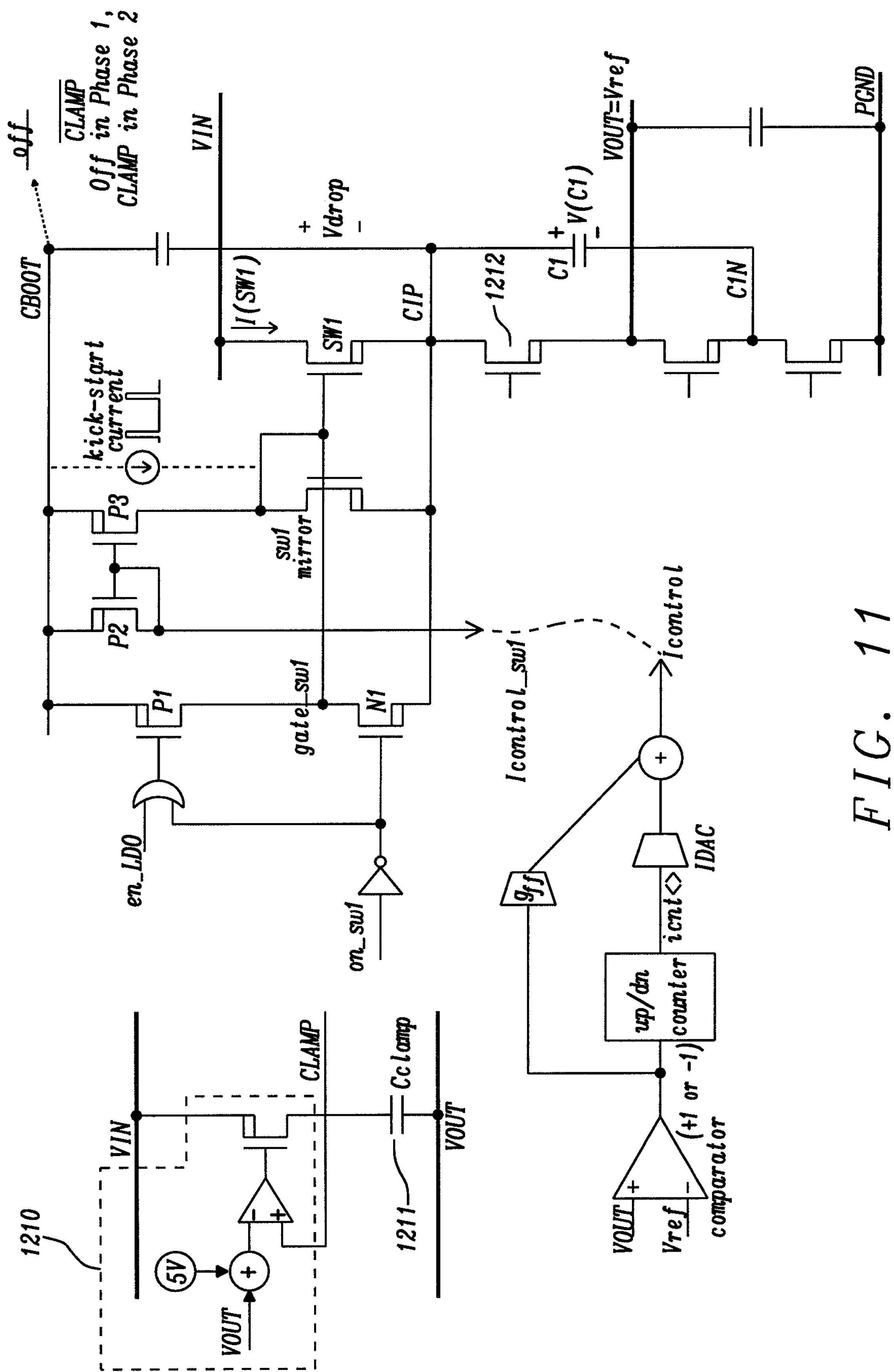
FIG. 11 shows a second variation of a charge pump with a voltage regulator.

Another possible variation is illustrated in FIG. 11. In the depicted scenario, a large external decoupling capacitor 1211 is used for CLAMP regulation, i.e. for the regulation of the high side power rail of the second transistor 1212. If an external decoupling capacitor 1211 is available for decoupling of the CLAMP voltage, a regulation circuit 1210 in FIG. 11 makes sense because of its simple design. In FIG. 11 the regulation circuit 1210 regulates CLAMP voltage on an external decoupling capacitor 1211, and the regulated CLAMP voltage is used to recharge a bootstrap capacitor when CBOOT is in low voltage. One advantage is that this regulated CLAMP voltage can be shared among multiple charge pumps in one chip, such as e.g. the two charge pumps illustrated in FIG. 1. The linear CLAMP regulation circuit can be built inside of the charge pump or can be an external stand-alone regulator.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A power converter comprising a flying capacitor, a first transistor, a second transistor, a third transistor, a fourth transistor, and a driver circuit for driving one of the four transistors, wherein the first transistor is directly, physically connected to an input terminal of the power converter and to a first terminal of the flying capacitor, the second transistor is directly, physically connected to the first terminal of the flying capacitor and to an output terminal of the power converter, the third transistor is directly, physically connected to the output terminal of the power converter and to a second terminal of the flying capacitor, the fourth transistor is directly, physically connected to the second terminal of the flying capacitor and to a reference potential, and the driver circuit is directly, physically connected to high side power rail and to a low side power rail, wherein the power converter further comprises a regulation circuit configured to regulate a high side voltage of the high side power rail such that the regulated high side voltage is independent of an input voltage at the input terminal of the power converter.

2. The power converter of claim 1, wherein the regulation circuit is configured to regulate the high side voltage of the high side power rail such that a voltage difference between the high side voltage of the high side power rail and a low side voltage of the low side power rail does not exceed a pre-determined value.

3. The power converter of claim 2, wherein the reference voltage is determined by a sum of a target output voltage at the output terminal plus a positive offset voltage.

4. The power converter of one of the preceding claims, wherein the driver circuit is configured to drive the second transistor, the regulation circuit comprises a comparator configured to generate an error signal by comparing the high side voltage with a reference voltage, and the regulation circuit comprises a modulation device configured to modulate a current between the input terminal of the power converter and the high side power rail based on said error signal.

5. The power converter of claim 4, wherein the low side power rail is coupled to the reference potential.

6. The power converter of claim 4, wherein a decoupling capacitor is coupled between the high side power rail and the low side power rail.

7. The power converter of claim 4, further comprising a bootstrap capacitor and another driver circuit configured to drive the first transistor, wherein the another driver circuit is coupled between a flying high side power rail and another low side power rail, the bootstrap capacitor is coupled between the flying high side power rail and the first terminal of the flying capacitor, and the another low side power rail is coupled to the first terminal of the flying capacitor.

8. The power converter of claim 7, wherein the regulation circuit is configured to regulate a flying voltage at the flying high side power rail such that the flying voltage approaches a sum of a voltage at the first terminal of the flying capacitor plus a positive offset voltage.

9. The power converter of claim 7, wherein the regulation circuit comprises a switching element configured to isolate, during a first time interval, the flying high side power rail from the high side power rail, and to connect, during a second time interval, the flying high side power rail with the high side power rail.

10. The power converter of claim 9, wherein the power converter is configured to, during the first time interval, close the third transistor, and open the second transistor and the fourth transistor for generating an electrical path from the input terminal of the power converter via the first transistor and via the flying capacitor to the output terminal of the power converter.

11. The power converter of claim 10, wherein the power converter is configured to, during the first time interval, operate the first transistor as a controllable power source for regulating an output voltage at the output terminal of the power converter if an overvoltage is detected at the input terminal of the power converter, and operate the first transistor as a switch which is either open or closed if no overvoltage is detected at the input terminal of the power converter.

12. The power converter of claim 11 comprising a current mirror configured to control a current through the first transistor for regulating the output voltage at the output terminal of the power converter during the first time interval converter if an overvoltage is detected at the input terminal of the power converter.

13. The power converter of claim 8, wherein the power converter is configured to, during the second time interval, open the first transistor and the third transistor, and close the second transistor and the fourth transistor for generating an electrical path from the reference potential via the flying capacitor to the output terminal of the power converter.

14. The power converter of claim 8, wherein the modulation device is configured to modulate the current between the input terminal of the power converter and the high side power rail based on said error signal only during the first time interval, the comparator is configured to generate another error signal by comparing the flying voltage at the flying high side terminal with another reference voltage during the second time interval, and the regulation circuit comprises another modulation device configured to modulate a current between the input terminal of the power converter and the flying high side power rail based on said another error signal during the second time interval.

15. A method for operating a power converter, wherein the power converter comprises a flying capacitor, a first transistor, a second transistor, a third transistor, a fourth transistor, and a driver circuit for driving one of the four transistors, the method comprising:

directly, physically connecting the first transistor an input terminal of the power converter and to a first terminal of the flying capacitor, directly, physically connecting the second transistor to the first terminal of the flying capacitor and to an output terminal of the power converter, directly, physically connecting the third transistor to the output terminal of the power converter and to a second terminal of the flying capacitor, directly, physically connecting the fourth transistor to the second terminal of the flying capacitor and to a reference potential, directly, physically connecting the driver circuit to a high side power rail and to a low side power rail, regulating a high side voltage of the high side power rail such that the regulated high side voltage is independent of an input voltage at the input terminal of the power converter.

16. The method of claim 15, further comprising regulating the high side voltage of the high side power rail such that a voltage difference between the high side voltage of the high side power rail and a low side voltage of the low side power rail does not exceed a pre-determined value.

17. The method of claim 16, comprising regulating the high side voltage of the high side power rail towards a reference voltage, wherein the reference voltage is determined by a sum of a target output voltage at the output terminal plus a positive offset voltage.

18. The method of claim 15, further comprising driving, by the driver circuit, the second transistor, generating an error signal by comparing the high side voltage with a reference voltage, and modulating a current between the input terminal of the power converter and the high side power rail based on said error signal.

19. The method of claim 18, the method further comprising providing a bootstrap capacitor and another driver circuit configured to drive the first transistor, coupling the another driver circuit between a flying high side power rail and another low side power rail, coupling the bootstrap capacitor between the flying high side power rail and the first terminal of the flying capacitor, and coupling the another low side power rail to the first terminal of the flying capacitor.

20. The method of claim 19, the method further comprising regulating a flying voltage at the flying high side power rail such that the flying voltage approaches a sum of a voltage at the first terminal of the flying capacitor plus a positive offset voltage.

21. The method of claim 20, the method further comprising isolating, by a switching element, during a first time interval, the flying high side power rail from the high side power rail, and connecting, by a switching element, during a second time interval, the flying high side power rail with the high side power rail.

* * * * *